United States Patent [19]

Seitz et al.

[11] Patent Number: 5,114,831
[45] Date of Patent: May 19, 1992

[54] PHOTOPOLYMERIZABLE LAMINATING MATERIAL

[75] Inventors: Friedrich Seitz, Friedelsheim; Gerhard Hoffmann, Otterstadt; Gerhard Bauer, Weinheim, all of Fed. Rep. of Germany

[73] Assignee: BASF Aktiengesellschaft, Ludwigshafen, Fed. Rep. of Germany

[21] Appl. No.: 562,568

[22] Filed: Aug. 2, 1990

[30] Foreign Application Priority Data

Aug. 12, 1989 [DE] Fed. Rep. of Germany ....... 3926708

[51] Int. Cl.$^5$ ............................................. G03C 1/68
[52] U.S. Cl. .................................. 430/281; 430/288; 430/271; 522/16; 522/63; 522/75; 522/91
[58] Field of Search .................. 430/271 A, 281, 288, 430/263; 522/16, 63, 75, 91

[56] References Cited

U.S. PATENT DOCUMENTS

| | | |
|---|---|---|
| 3,622,334 | 11/1971 | Matawan et al. . |
| 3,645,772 | 2/1972 | Jones . |
| 3,751,259 | 8/1973 | Bauer et al. . |
| 3,887,450 | 6/1974 | Gilano et al. . |
| 3,953,309 | 4/1976 | Gilano et al. . |
| 4,234,675 | 11/1980 | Kuznetsov . |
| 4,268,610 | 5/1981 | Roos ................................... 430/281 |
| 4,680,249 | 7/1987 | Weed . |
| 4,710,262 | 12/1987 | Weed . |
| 4,741,987 | 5/1988 | Tohda et al. . |

FOREIGN PATENT DOCUMENTS 0049504 10/1981 European Pat. Off. .
0247549 5/1987 European Pat. Off. .

OTHER PUBLICATIONS

JA-A 61/223 836 Japanese Abstract.
JP-A 62/278 541 Japanese Abstract.
Helv. Chim Acta 79 (1987) 2118-2123.

Primary Examiner—Jack P. Brammer
Attorney, Agent, or Firm—Keil & Weinkauf

[57] ABSTRACT

These photopolymerizable laminating materials consist of at least one film-forming polymer as a binder, at least one organic compound which is compatible with the binder, has at least two double bonds capable of addition polymerization and may be partially replaced by an organic compound having only one double bond capable of addition polymerization, a photoinitiator or photoinitiator system and an adhesion promoter, with or without conventional additives and assistants, the adhesion promoter used being a tricyclic heteroaromatic compound which is soluble in aqueous alkaline solutions.

The said laminating materials are suitable for the production of printed circuits.

12 Claims, No Drawings

PHOTOPOLYMERIZABLE LAMINATING MATERIAL

The present invention relates to a photopolymerizable laminating material which has improved adhesion in aqueous plating and etching baths, in particular a photoresist film which can be developed in aqueous alkaline developers and is intended for the production of printed circuits.

Printed circuits can be produced by transferring a photosensitive laminating material, at elevated temperatures and under pressure, from a temporary substrate to a metallic substrate, preferably copper-plated epoxy resin material. After exposure of the photosensitive layer through an image-bearing transparency, in the case of negative resists the unexposed parts are removed using a developer. In the case of laminating materials which can be developed in aqueous alkaline media, the developer generally used is aqueous sodium carbonate solution. The bared metal surface can then be permanently modified, for example by electroplating. In the case of poor adhesion between the laminating material and the metal surface, the plating solution migrates under the laminating material and metal is also deposited in places where metal deposition is undesirable. This results in ill-defined edges and in extreme cases short-circuits may occur between adjacent conductors.

To solve this problem, it has been proposed that suitable adhesion promoters be added to the laminating material. Examples of such adhesion promoters are benzotriazole (DE-A-2063571, U.S. Pat. No. 3,645,772) and a number of its derivatives (DE-A-3600442, EP-A-2475549, U.S. Pat. No. 4,680,249, U.S. Pat. No. 4,710,262, JP 61223836 and JP 62278541). However, the improvement in adhesion produced by these compounds is insufficient in many cases.

The triazole compounds used to date as adhesion promoters have a considerable disadvantage, particularly when they are used in photoresist films which can be developed in aqueous alkaline media: if the circuit boards are stored for a few days to weeks during the production process, between lamination and development, a layer (referred to below as residual layer) which is resistant to the developer and which makes further processing of the circuit boards impossible is formed on the metal surface, particularly at temperatures above normal room temperature and at high atmospheric humidity. This is a latent problem in the case of all laminating materials which can be developed in aqueous alkaline media.

Surprisingly, it is possible considerably to improve the adhesion between metal and laminating material and at the same time completely to prevent the formation of the residual layer if alkali-soluble, tricyclic heteroaromatic compounds are used as adhesion promoters.

The present invention relates to a photopolymerizable laminating material, consisting of
(a) at least one film-forming polymer as a binder,
(b) at least one organic compound which is compatible with the binder, has at least two double bonds capable of addition polymerization and may be partially replaced by an organic compound having only one double bond capable of addition polymerization,
(c) a photoinitiator or photoinitiator system and
(d) an adhesion promoter, with or without
(e) conventional additives and assistants, wherein the adhesion promoter (d) used is a tricyclic heteroaromatic compound which is soluble in aqueous alkaline solutions.

In particular, the laminating material is one which can be developed in aqueous alkaline solutions, for example in aqueous sodium carbonate solution.

Suitable compounds (d) to be used according to the invention are those which are soluble in an aqueous alkaline solution. A suitable criterion is the solubility in an aqueous solution which contains 1 part by weight of sodium carbonate per 100 parts by weight of solution. Compounds which are suitable for use in the novel photopolymerizable laminating materials are in particular those whose solubility at 25° C. is not less than 0.05% by weight in the 1% strength sodium carbonate solution described above. Compounds which have a solubility of not less than 0.1% by weight under the stated conditions are preferred, those having a solubility of not less than 0.2% by weight being particularly preferred.

The tricyclic heteroaromatic compounds suitable as adhesion promoters (d) preferably have a structure of the general formula (I)

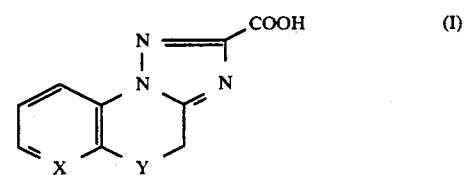

where X is CH or N, Y is O, S or $NR^1$ and $R^1$ is H, alkyl, for example of 1 to 6 carbon atoms, such as methyl, ethyl, propyl, butyl, cyclohexyl or aryl, e.g. phenyl.

These compounds can be synthesized, for example by the preparation methods in Helv. Chim. Acta 70 (1987), 2118–2129.

Examples of particularly preferred novel adhesion promoters (d) are those of the formulae (II) and (III)

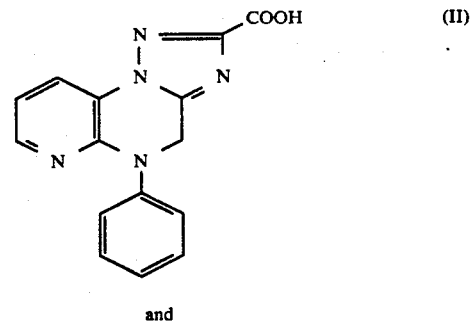

and

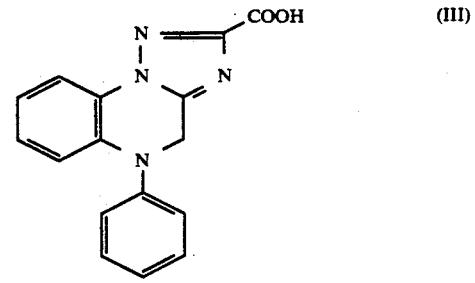

The tricyclic heteroaromatic compounds (d) used as adhesion promoters are present in the novel laminating materials in general in a concentration of from 0.01 to 5, preferably from 0.1 to 2, particularly preferably from 0.2 to 1, % by weight, based on the total weight of the photopolymerizable laminating material. It is also possible, and in specific cases advantageous, to employ mixtures of the compounds to be used according to the invention.

Regarding the other components of the novel laminating material, the following may be stated specifically.

(a) Film-forming polymers (a) suitable for use as binders are polymeric binders which are insoluble in water but soluble or at least dispersible in aqueous alkaline solutions, in particular copolymers containing carboxyl or carboxylic anhydride groups, for example styrene/maleic anhydride copolymers, styrene/maleic half-ester copolymers, alkyl (meth)acrylate/(meth)acrylic acid copolymers, copolymers of styrene, alkyl (meth)acrylates and (meth)acrylic acid and, if required, other monomers (cf. inter alia DE-B-20 27 467, DE-A-22 05 146, EP-A-496 504 or DE-A-27 36 058), or copolymers which contain acrylic acid and/or methacrylic acid, hydrophobic comonomers and N-vinylamides as polymerized units, as described in, for example, DE-A-34 47 356. Such copolymers may contain as polymerized units, for example, from 10 to 50% by weight of a vinylamide, e.g. N-vinylformamide, N-vinylacetamide or N-vinyl-N-methylacetamide, or an N-vinyllactam, such as N-vinylpyrrolidone and/or N-vinylcaprolactam, from 5 to 30% by weight of acrylic acid and/or (meth)acrylic acid and from 30 to 80% by weight of at least one hydrophobic comonomer which as such forms homopolymers which are insoluble in water and aqueous alkaline solutions.

Examples of the last-mentioned hydrophobic comonomers are: vinylaromatics, e.g. styrene, substituted styrenes which are substituted in the side chain or in the nucleus by, for example, alkyl or halogen, such as α-methylstyrene, p-methylstyrene and the like, vinyl acetate and the esters of acrylic acid and methacrylic acid, in particular the acrylates and methacrylates of straight-chain or branched monoalkanols, preferably of 1 to 4 carbon atoms, particularly advantageous compounds among these being methyl methacrylate, etc. The copolymer may contain one or more of the hydrophobic comonomers as polymerized units, and the content of the hydrophobic comonomer units in the copolymer may be from 30 to 80, preferably from 40 to 70, % by weight, based on the copolymer.

Examples of copolymers for use as polymeric binders in the photosensitive laminating materials include N-vinyllactam/(meth)acrylic acid/methyl methacrylate copolymers or N-vinyllactam/(meth)acrylic acid/styrene copolymers. In a typical embodiment, these copolymers may contain the comonomers as polymerized units, for example in amounts of from 25 to 35% by weight of N-vinylcaprolactam and/or N-vinylpyrrolidone, from 5 to 15% by weight of (meth)acrylic acid and from 55 to 65% by weight of hydrophobic comonomers, based in each case on the copolymer.

Examples of other suitable polymeric binders (a) are styrene/(meth)acrylic acid/methyl methacrylate/ethyl acrylate copolymers which contain, for example, from 10 to 40% of styrene, from 20 to 30% of methacrylic acid, from 5 to 50% of methyl methacrylate and from 0 to 50% of ethyl acrylate as polymerized units.

The type and amount of the comonomers for the copolymers (a) to be used are chosen within the abovementioned general range so that the copolymers are film-forming and meet the requirements set with regard to their solubility or dispersibility. If necessary, mixtures of suitable carboxyl-containing copolymers can also be used.

The copolymers to be used as polymeric binders can be prepared by the conventional polymerization methods by copolymerization of comonomers, for example in solutions. For example, lower alkanols, ketones, esters and the like, such as methanol, acetone, methyl ethyl ketone, ethyl acetate, etc., are suitable solvents for the solution polymerization. Suitable polymerization initiators are the conventional free radical initiators, for example azobisisobutyronitrile, benzoyl peroxide and the like.

The film-forming polymers (a) used as binders are present in the photopolymerizable laminating material in general in an amount of from 40 to 90, preferably from 50 to 70, % by weight, based on the total weight of the photopolymerizable laminating material.

(b) The conventional photopolymerizable monomers, preferably those having boiling points above 100° C. and molecular weights of <1,000, can be used as organic compounds (b) having at least two double bonds capable of addition polymerization.

Typical photopolymerizable monomers are, in particular, the derivatives of (meth)acrylic acid and very particularly the (meth)acrylates. Examples of these are the di- and tri(meth)acrylates of ethylene glycol, diethylene glycol, triethylene glycol or polyethylene glycols having a molecular weight of not more than about 500, 1,2-propanediol, 1,3-propanediol, polypropylene glycols having a molecular weight of not more than about 500, 1,4-butanediol, 1,1,1-trimethylolpropane, 2,2-dimethylpropanediol, glycerol or pentaerythritol, for example pentaerythritol tetra(meth)acrylate, glucose tri- or tetra(meth)acrylate. The organic compounds which are compatible with the binder and have at least two double bonds capable of addition polymerization may be replaced partially, in general in minor amounts of not more than about 30% by weight, based on the total amount of component (b), by organic compounds having only one double bond capable of addition polymerization. Suitable compounds of this type are, for example, the monoacrylates and monomethacrylates of the stated diols and polyols, e.g. ethylene glycol mono(meth)acrylate, di-, tri- or tetraethylene glycol mono(meth)acrylate, propanediol mono(meth)acrylate and butanediol mono(meth)acrylate, and the (meth)acrylates of monoalkanols, in particular of those of 1 to 20 carbon atoms. In addition to the preferred acrylates and methacrylates of the abovementioned type, other examples of photopolymerizable monomers are the allyl compounds and other vinyl compounds, e.g. N-vinylpyrrolidone, N-vinylcaprolactam, vinyl acetate, vinyl propionate, (meth)acrylamide, N-methylol(meth)acrylamide, the bisethers of ethylene glycol and of N-methylol(meth)acrylamide, vinylcarbamates and bisacrylamidoacetic acid.

Other suitable ethylenically unsaturated, photopolymerizable compounds for the novel photosensitive recording layers are the monomeric urethane acrylates or methacrylates having two or more acryloyl and/or methacryloyl groups. Such monomeric urethane (meth)acrylates can be obtained, for example, by reacting aliphatic di- or polyols with organic diisocyanates in amounts such that the ratio of the number of equivalents of OH to that of NCO is about 1:2, and then reacting the free isocyanate groups of the resulting reaction product with suitable acryloyl and/or methacryloyl compounds, for example hydroxyalkyl (meth)acrylates. Suitable aliphatic di- or polyols include the di- and polyhydroxy compounds stated above in connection with the di- and tri(meth)acrylates; examples of organic diisocyanates are hexamethylene diisocyanate, toluylene diisocyanate, isophorone diisocyanate and the like; hydroxyalkyl (meth)acrylates are, for example, hydroxyethyl (meth)acrylate, propanediol mono(meth)acrylate or butanediol mono(meth)acrylate. Monomers having two or more acryloyl and/or methacryloyl groups, as can be obtained, for example, by reacting di- or polyglycidyl compounds with acrylic acid and/or methacrylic acid, are just as suitable and advantageous. Particularly suitable di- and polyglycidyl compounds here are the di- and polyglycidyl ethers of polyhydric phenols, for example of bisphenol A or of the substitution products of bisphenol A. Noteworthy examples of such monomers containing acryloyl and/or methacryloyl groups are the reaction products of bisphenol A bisglycidyl ether with acrylic and/or methacrylic acid in a molar ratio of about 1:2.

The compounds (b) which have at least two double bonds capable of addition polymerization and which may be partially replaced by an organic compound having only one double bond capable of addition polymerization are advantageously chosen so that they are compatible with the film-forming polymers (a) used as binders. In general, the photopolymerizable monomers are present in a concentration of from 10 to 60, preferably from 20 to 40, % by weight, based on the total weight of the photopolymerizable laminating material.

(c) Suitable photoinitiators or photoinitiator systems (c) for the photopolymerizable laminating materials are the photoinitiators or photoinitiator systems which are known per se and are conventionally used for photosensitive, photopolymerizable recording materials. Examples of these are benzoin, benzoin ethers, in particular benzoin alkyl ethers, substituted benzoins, alkyl ethers or substituted benzoins, e.g. α-methylbenzoin alkyl ethers or α-hydroxymethylbenzoin alkyl ethers; benzils, benzil ketals, in particular benzil dimethyl ketal, benzil methyl ethyl ketal or benzil methyl benzyl ketal; the acylphosphine oxide compounds which are known and effective photoinitiators, e.g. 2,4,6-trimethylbenzoyldiarylphosphine oxide; benzophenone, derivatives of benzophenone, 4,4'-dimethylaminobenzophenone, derivatives of Michler's ketone; anthraquinone and substituted anthraquinones; aryl-substituted imidazoles and their derivatives, e.g. 2,4,5-triarylimidazole dimers; thioxanthone derivatives and the acridine or phenacine derivatives which are effective photoinitiators. Examples of initiator systems are combinations of the stated initiators with sensitizers or activators, in particular tertiary amines.

Typical examples of such initiator systems are combinations of benzophenone or benzophenone derivatives with tertiary amines, e.g. Michler's ketone, triethanolamine or ethyl dimethylaminobenzoate, or mixtures of a thioxanthone derivative, a tertiary amine and a hexaarylbisimidazole derivative. The photoinitiators or photoinitiator systems (c) are present in the photopolymerizable laminating material in an amount of from 0.01 to 10, preferably from 0.5 to 5, % by weight.

(e) Examples of suitable further additives and assistants (e) which may be present in the novel photopolymerizable laminating material are thermal polymerization inhibitors, dyes and/or pigments, photochromic compounds or systems, sensitometric regulators, plasticizers, leveling agents, dulling agents, lubricants and the like. Examples of suitable polymerization inhibitors are hydroquinone, hydroquinone derivatives, 2,6-di-tert-butyl-p-cresol, nitrophenols, N-nitrosamines, such as N-nitrosodiphenylamine or the salts of N-nitrosocyclohexylhydroxylamine. Examples of dyes and/or pigments, which may both act as contrast agents and reinforce the layer, include Brilliant Green Dye (C.I. 42,040), Victoria Sky Blue FGA, Victoria Sky Blue BO (C.I. 42,595), Victoria Blue B (C.I. 44,045), Rhodamine 6 G (C.I. 45,160), triphenylmethane dyes, naphthalimide dyes and 3'-phenyl-7-dimethylamino-2,2'-spiro-di-(2H-1-benzopyran).

Photochromic systems which change their color reversibly or irreversibly on exposure to actinic light without interfering with the photopolymerization process are, for example, leuco dyes, together with suitable activators. Examples of leuco dyes are the leuco bases of the triphenylmethane dyes, such as crystal violet leuco base and malachite green leuco base, leuco basic blue, leuco pararosaniline, leuco patent blue A or V; Rhodamine B Base is also suitable. Suitable activators for these photochromic compounds include organic halogen compounds which eliminate halogen radicals on exposure to actinic light, or hexaarylbisimidazoles. The sensitometric regulators include compounds such as 9-nitroanthracene, 10,10'-bis-anthrone and phenazinium, phenoxazinium, acridinium or phenothiazinium dyes, in particular in combination with mild reducing agents, such as thiourea, anethole, salts of N-nitrosocyclohexylhydroxylamine, 1,3-dinitrobenzenes and the like. The conventional low molecular weight or high molecular weight esters, such as phthalates or adipates, toluenesulfonamide or tricresyl phosphate, may be used as plasticizers. The additives and/or assistants are present in the photopolymerizable laminating materials in the known effective amounts usual for these substances. However, the amount thereof should in general not exceed 30, preferably 20, % by weight, based on the photopolymerizable laminating material.

The ratio in which the individual components are present in the photopolymerizable laminating material is in general chosen so that the laminating material is not only capable of being developed in aqueous alkaline media but advantageously is also solid and nontacky at room temperature and has good film-forming properties. For the use of the novel photosensitive laminating materials as a photoresist film, the composition is moreover chosen so that the photosensitive recording layer can be readily laminated and can be transferred to a substrate with the use of pressure and, if required, heat. For the production of resist images, the thickness of the photosensitive recording layer is usually adjusted to about 1-50 μm.

Substrates which are preferably used for laminating materials are plastic films or sheets, in particular polyester sheets, which have moderate adhesion to the photosensitive recording layer and, after lamination of the photopolymerizable recording layer with a substrate, can be peeled off from the said recording layer, before or after exposure to actinic light.

That side of the novel photopolymerizable laminating material which faces away from the substrate can be covered with a cover sheet, for example of a polyolefin, such as polyethylene or polypropylene.

The novel photopolymerizable laminating material can be produced in a conventional manner by preparing a homogeneous mixture of the components forming the photopolymerizable laminating material and applying this mixture in the form of a layer to the substrate, which may have been provided with an intermediate layer. For example, the components of the photopolymerizable laminating material can be mixed purely mechanically in a suitable mixing apparatus, for example a mixer or extruder, to give a homogeneous mixture, and the latter can be formed, for example by extrusion, calendering or pressing, into a layer of the desired thickness, which is then laminated with the substrate. However, the photopolymerizable laminating materials are preferably produced by dissolving the components of the said laminating material in a suitable solvent or solvent mixture and applying this solution in the desired layer thickness to the substrate by casting, immersing, spraying or other known application methods. Thereafter, the solvent is removed in a conventional manner and the photopolymerizable laminating material is dried. Suitable solvents for mixing the components and applying the photopolymerizable laminating material to the substrate include lower alcohols, ketones or esters, e.g. methanol, acetone, methyl ethyl ketone, ethyl acetate and the like, and mixtures thereof. If desired, a top layer or cover sheet may then also be applied to the photopolymerizable laminating material.

The novel photopolymerizable laminating material can be advantageously used for the production of resist images by conventional methods. For this purpose, the said laminating material is exposed imagewise to actinic light, after transfer of the layer to the substrate to be protected, the conventional sources of actinic light, for example UV fluorescent tubes, high pressure, medium pressure or low pressure mercury lamps, superactinic fluorescent tubes, pulsed xenon lamps, UV lasers, argon lasers and the like, being suitable for this purpose. The wavelength emitted by the light sources should in general be from 230 to 450 nm, preferably from 300 to 420 nm, and in particular should be matched with the self-absorption of the photoinitiator present in the photopolymerizable laminating material.

As a result of the imagewise exposure to the actinic light, photopolymerization is initiated in the exposed parts of the laminating material, the said photopolymerization leading to crosslinking in the exposed parts of the layer and hence to a difference in the solubilities of the exposed and unexposed parts of the layer. After the imagewise exposure, the resist image is developed by washing out the unexposed, non-crosslinked parts of the laminating material with an aqueous alkaline developer. Development may be effected by washing, spraying, rubbing, brushing, etc. Suitable developers are aqueous alkaline solutions which, in order to obtain the advantageous pH, in general from 8 to 14, preferably from about 9 to 13, contain alkaline substances, for example borax, disodium hydrogen phosphate, sodium carbonate, alkali metal hydroxides or organic bases, such as di- or triethanolamine, dissolved in water. The aqueous alkaline developers may also contain buffer salts, for example water-soluble alkali metal phosphates, silicates, borates, acetates or benzoates. Wetting agents, preferably anionic wetting agents, and, if necessary, water-soluble polymers, for example sodium carboxymethylcellulose, polyvinyl alcohol, polysodium acrylate and the like, may be present as further components of the developers. Although the novel laminating materials are generally washed out with purely aqueous alkaline developers, it is of course in principle possible, although not necessary, for the aqueous alkaline developers also to contain small added amounts of water-soluble organic solvents, for example aliphatic alcohols, acetone or tetrahydrofuran.

The novel photopolymerizable laminating materials have excellent adhesion to metallic surfaces. The high adhesion is also retained in aqueous process baths, in particular in the plating solutions usually used in the production of printed circuits. This enables even fine image elements to be reproduced faithfully to the original and reliably. In spite of the good adhesion, the stripping time of the exposed laminating material is reduced by the tricyclic heteroaromatic compounds which are to be used according to the invention and are soluble in aqueous alkaline solutions. Another considerable advantage of the said heteroaromatic compounds is that the formation of a residual layer during storage of laminated metallic substrates is completely prevented.

The Examples which follow illustrate the invention in more detail. In the Examples, parts and percentages are by weight, unless stated otherwise.

EXAMPLES 1a and 1b

For the production of a photoresist film, casting solutions were prepared by mixing the following components:

| (1) | 37% strength solution (in 1:1 methyl ethyl ketone/isopropanol) of a copolymer of 24% of styrene, 35% of methyl methacrylate, 11% of butyl acrylate and 30% of methacrylic acid, having a Fikentscher K value of 51 | 149.80 g |
|---|---|---|
| (2) | Trimethylolpropane triacrylate | 38.00 g |
| (3) | Sicomet ® Patent Blue 80E131 | 0.05 g |
| (4) | Ethyl p-dimethylaminobenzoate | 3.00 g |
| (5) | Isopropylthioxanthone | 0.50 g |
| (6) | For Example 1a, a compound of the formula (II) | 0.50 g |
|  | For Example 1b, a compound of the formula (III) | 0.50 g |

These casting solutions were applied to a 23 μm thick polyethylene terephthalate film in such a way that, after evaporation in the air and drying at 90° C. for 5 minutes, a dry photopolymerizable layer having a thickness of 38 μm resulted. The said layer was covered with a 30 μm thick polyethylene film. Thereafter, the laminate of polyester film, photopolymerizable layer and polyethylene film was rolled up. For the test, the polyethylene film was removed and the resist film was transferred to the copper-plated surface of a circuit board substrate, with the photosensitive layer facing the copper (105° C., 1.5 m/minute). The resist layer was then exposed through a test negative in a Riston ® PC Printer (manufacturer: E.I. Du Pont de Nemours). After exposure, the polyester film was removed and the resist was developed for 30 seconds in 1% strength sodium carbonate solution.

For permanent structuring of the circuit board substrate, the latter was subjected to the usual pretreatment steps, such as cleaning and etching, and was then introduced into a tin bath, and those parts of the metal surface which were not protected by the resist were plated with a 38 μm thick tin layer. Thereafter, the exposed resist was removed in 3% strength KOH solution at 50° C., 35 seconds being required for complete removal of the resist. The edge crispness of the conductors produced by electroplating was then assessed under a microscope on the basis of the following scale of marks:

| Mark | Assessment |
|------|------------|
| 1 | Sharp edges |
| 2 | Ill-defined edges in isolated places, where the resist has suffered under-migration of up to 5 μm |
| 3 | Ill-defined edges over the entire circuit board, where the resist has suffered under-migration of up to 5 μm |
| 4 | Under-migration >5 μm |
| 5 | Short-circuits between adjacent conductors |

In both cases, the edge crispness was awarded the mark 1.

To test the residual layer, the resists were laminated with circuit board substrates and stored for 10 days at 27° C. and 65% relative humidity. Development and etching were then carried out. The residual layer was measured as the proportion of the surface (in %) which can no longer be etched. The resists of Examples la and lb had no resist layer under the stated conditions.

COMPARATIVE EXAMPLE

Example la was repeated, except that the novel compounds of the formula (II) or (III) were not added. The test was carried out as in Example 1. The following results were obtained:

| | |
|---|---|
| Stripping time: | 50 seconds |
| Edge crispness: | Mark 5 |
| Residual layer: | 100% |

We claim:
1. A photopolymerizable laminating material, consisting essentially of
   (a) at least one film-forming polymer as a binder,
   (b) at least one organic compound which is compatible with the binder, has at least two double bonds capable of addition polymerization,
   (c) a photoinitiator or photoinitiator system and
   (d) an adhesion promoter of the formula (I)

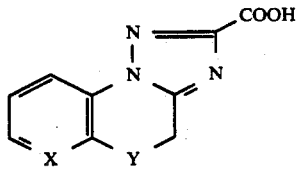

where X is CH or N, Y is O, S or $NR^1$ and $R^1$ is H, alkyl or aryl, or a tautomer thereof, the amount of a, b, c and d, respectively, in the laminating material being from 40 to 90, 10 to 60, 1.0 to 10 and 0.1 to 2 percent by weight.

2. A laminating material as defined in claim 1, which can be developed in aqueous alkaline solutions.

3. A laminating material as defined in claim 1, wherein the tricyclic heteroaromatic compound used as the adhesion promoter has a solubiity of not less than 0.05% by weight in a 1% strength by weight aqueous sodium carbonate solution at 25° C.

4. A laminating material as defined in claim 1, wherein the adhesion promoter (d) used is a compound of the formula

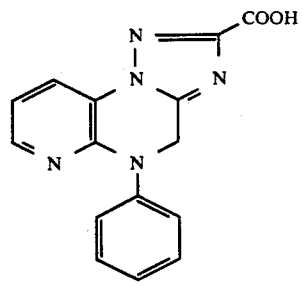

or

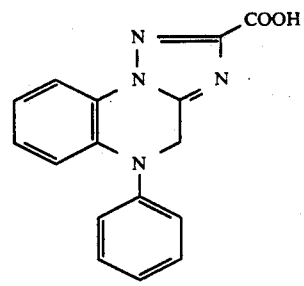

or a mixture of these two compounds.

5. A laminating material as defined in claim 1, wherein the binder used is a copolymer of at least one acidic monomer and at least one hydrophobic monomer.

6. A laminating material as defined in claim 5, wherein the acidic monomer used is acrylic acid or methacrylic acid.

7. A laminating material as defined in claim 5, wherein the hydrophobic monomers are selected from the group consisting of the acrylates, methacrylates and styrenes.

8. A laminating material as defined in claim 6, wherein the hydrophobic monomers are selected from the group consisting of the acrylates, methacrylates and styrenes.

9. A laminating material as defined in claim 1, wherein the amount of a, b, c and d, respectively, in the laminating material is from 50 to 70, 20 to 40, 0.5 to 10 and 0.2 to 1 percent by weight.

10. A laminating material as defined in claim 1, which includes (e) conventional additives and assistants which are selected from thermal fluidization inhibitors, dyes and/or pigments, photochromic compounds or systems, sensitonmetric regulators, plasticizers, leveling agents, dulling agents, and lubricants.

11. A photopolymerizable laminating material, consisting essentially of
   (a) at least one film-forming polymer as a binder,
   (b) is a mixture of at least one organic compound which is compatible with the binder and has at least two double bonds capable of addition polymerization and an organic compound having only one double bond capable of addition polymerization,
   (c) a photoinitiator or photoinitiator system and
   (d) an adhesion promoter of the formula (I)

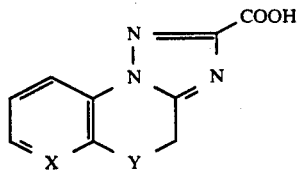

(I)

where X is CH, or N, Y is O, S or NR$^1$ and R$^1$ is H, alkyl or aryl, or a tautomer thereof, the amount of a, b, c and d, respectively, in the laminating material being from 40 to 90, 10 to 60, 0.1 to 10 and 0.1 to 2 percent.

12. A laminating material as defined in claim 11, which includes (e) conventional additives and assistants which are selected from thermal fluidization inhibitors, dyes and/or pigments, photochromic compounds or systems, sensitometric regulators, plasticizers, leveling agents, dulling agents, and lubricants.

* * * * *